United States Patent
Oishi

(10) Patent No.: US 6,208,012 B1
(45) Date of Patent: *Mar. 27, 2001

(54) ZENER ZAP DIODE AND METHOD OF MANUFACTURING THE SAME

(75) Inventor: Tetsuya Oishi, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/786,862

(22) Filed: Jan. 22, 1997

(30) Foreign Application Priority Data

Jan. 24, 1996 (JP) .................................... 8-028727

(51) Int. Cl.[7] .................................... H01L 29/90
(52) U.S. Cl. .................. 257/565; 257/423; 257/479; 257/47; 257/197; 257/910; 257/480; 257/481; 257/566
(58) Field of Search .............................. 257/50, 173, 529, 257/530, 665, 910, 922, 47, 197, 423, 481, 483, 479, 556, 557, 565, 566

(56) References Cited

U.S. PATENT DOCUMENTS 5,442,226 * 8/1995 Maeda et al. .................. 257/557

FOREIGN PATENT DOCUMENTS 0 426 241 A2    5/1991    (EP) .
WO 85/03599    8/1985    (WO) .

OTHER PUBLICATIONS

Patent Abstracts of Japan, vol. 17, No. 110 (E–1329), Mar. 8, 1993 & JP 04 293270A (Toshiba Corp.), Oct. 16, 1992.
Patent Abstracts of Japan, vol. 18, No. 464, (E–1598), Aug. 29, 1994 & JP 06 151897 A (Sony Corp), May 31, 1994.

* cited by examiner

Primary Examiner—Fetsum Abraham
(74) Attorney, Agent, or Firm—Sonnenschein, Nath & Rosenthal

(57) ABSTRACT

The invention provides a zener zap diode having a high reliability and a method of manufacturing the same that can remove the problems accompanied with the zener zap trimming. In order to attain the object, the zener zap diode according to the invention is constructed such that, in an area adjacent to the surface of a semiconductor substrate, an active base region, an outer base region, and an emitter region are formed. Furthermore, a base lead electrode (one polysilicon layer) is formed to overlay the outer base region, and an emitter lead electrode (another polysilicon layer) is formed above the active base region. A contact between the one polysilicon layer and a metal interconnecting layer is disposed right above the outer base region. Since the insulation film that hinders the filament from being formed is not disposed under the one polysilicon layer, a filament is widely formed into an N-type well region when a PN junction is zapped by the zener zap trimming method.

1 Claim, 10 Drawing Sheets

ZENER ZAP DIODE AND METHOD OF MANUFACTURING THE SAME

BACKGROUND OF THE INVENTION

1. Field of the Invention

The present invention relates to a zener zap diode having a construction in which a conductive layer such as a polycrystalline silicon layer is formed on an outer base region constituting a base region and a contact between the conductive layer and a metal interconnecting layer for a base electrode is formed.

2. Description of Related Art

FIG. 1 illustrates a construction of a conventional zener zap diode formed at the same time with bipolar transistors, which will now be described using the references of parts from the bipolar transistor formed at the same time with the zener zap diode. In this figure, a device isolation film 103 by means of the LOCOS (Local Oxidation of Silicon) method is selectively formed in an N-type well region 102 formed on a P-type silicon substrate 101. An insulation film 104 for determining an area in which an outer base region 107 of a P-type described later is formed is selectively formed on the device isolation film 103 and the N-type well region 102. Furthermore, a first polysilicon layer 105 as a base lead electrode is formed so as to partially cover the insulation film 104. The polysilicon layer 105 is overlaid with a field insulation film 106.

The outer base region 107 which is made of a P-type impurity diffusion layer and constitutes a base region, and an active base region 108 are formed in areas adjacent to the surface of the silicon substrate 101 determined by the insulation film 104. An emitter region 109 made of an N-type impurity diffusion layer is formed in the silicon substrate 101 on the upper side of the active base region 108. The emitter region 109 and the active base region 108 constitute a PN junction of the zener zap diode.

A pit 110 reaching the emitter region 109 through the polysilicon layer 105 and the field insulation film 106 is formed on the upper side of the emitter region 109. A side wall insulation film 111 made of a silicon oxide film is formed around the inner wall of the pit 110 to completely isolate the emitter region 109 from the polysilicon layer 105.

A second polysilicon layer 112 as an emitter lead electrode is formed on the emitter region 109 and is extended to overlay the side wall 111 and a part of the field insulation film 106. A metal interconnecting layer 113-1 for connecting the emitter lead electrode is selectively formed on the polysilicon layer 112.

The first polysilicon layer 105 extends to the upper surface of the insulation film 104 formed on the device isolation film 103. A pit 114 reaching the polysilicon layer 105 is provided with the field insulation film 106 above the device isolation film 103. Forming the pit 114 gives a contact 114a between the polysilicon layer 105 and a metal interconnecting layer 113-2 for the base.

Thus, in the conventional zener zap diode, to reduce the parasitic capacity of the outer base region 107, the contact 114a between the first polysilicon layer 105 connected to the outer base region 107 and the metal interconnecting layer 113-2 has been disposed above the device isolation film 103.

In the manufacturing process of the integrated circuit (IC) comprising multiple semiconductor devices such as bipolar transistors and zener zap diodes, the so-called trimming process is a common exercise. The trimming process is conducted to save the IC chip from being disposed as totally defective due to a partial failure of the semiconductors. Namely, when there is a partial failure among the multiple semiconductor devices formed on one IC chip, the junctions configuring the semiconductor devices in failure are cut off, or on the contrary, short-circuited to change the defective semiconductor devices into resistors; thus saving the total of the IC chip. Especially when the semiconductor devices are zener zap diodes, the method called zener zap trimming is applied.

However, in the conventional zener zap diode in which the contact r abetween the first polysilicon layer 105 connected to the outer base region 107 and the metal interconnecting layer 113-2 is disposed above the device isolation film 103, as shown in FIG. 1, trimming will cause the following problems.

When the zener zap trimming method is applied to a zener zap diode, that is, short-circuiting is done between the active base region 108 and the emitter region 109 to zap the PN junction, a filament 120 is formed from the emitter region 109 through the metal interconnecting layer 113-2 of the base lead region, as shown in FIG. 2. The filament 120 is an alloy of aluminum and silicon constituting the metal interconnecting layer 113-2, which is a product by a short-circuiting current running from the metal interconnecting layer 113-1 on the emitter side through the metal interconnecting layer 113-2 on the side of the base. The filament 120 is not formed in the silicon oxide film, and is formed only in the conductive layer and semiconductor layer. Therefore, as shown in FIG. 2, the filament 120 is not formed in the device isolation film 103 and the insulation film 104 thereon, and is concentratedly formed in an inner area of the polysilicon layer 105 as far as an area above the device isolation film 103 is concerned. Thereby, an excessive stress is applied to the field insulation film 106 on the polysilicon layer 105, thus producing a possibility for a damage including cracks. Furthermore, the depth of the filament 120 is less than the depth of the polysilicon layer 105 in the area above the device isolation film 103; and therefore, the resistance after trimming increases in this area. Still more, the area in which the filament 120 is formed is not stabilized, and is inclined to be differently formed by each trimming and the resistance after trimming is dispersed to a large extent. Consequently, it has been difficult to secure a sufficient reliability on the IC chip regenerated by the trimming.

SUMMARY OF THE INVENTION

The present invention has been made in view of the foregoing problems, and an object of the invention is to provide a zener zap diode whereby the problems accompanied with the trimming are removed to secure a high reliability, and a method of manufacturing the same.

A zener zap diode relating to the present invention is provided with a first region of a first conductive type and a second region of a second conductive type constituting a PN junction in an area adjacent to a surface of a semiconductor substrate, a conductive layer as an electrode formed on a third region of the first conductive type connected to the first region of the first conductive type, and a metal interconnecting layer for the electrode electronically connected to the conductive layer. In the zener zap diode, at least a part of a contact between the conductive layer and the metal interconnecting layer for the electrode is disposed so as to overlie the third region of the first conductive type.

Another zener zap diode relating to the invention, whose construction will be described using the references of parts from the bipolar transistor formed at the same time with the zener zap diode, is provided with a base region and an emitter region constituting a PN junction of the zener zap diode in an area adjacent to a surface of a semiconductor substrate, a conductive layer as a base lead electrode formed on an outer base region of the base region, and a metal interconnecting layer for a base electrode electronically connected to the conductive layer. In the zener zap diode, at least a part of a contact between the conductive layer and the metal interconnecting layer for the base electrode is disposed so as to overlie the outer base region.

A method of manufacturing a zener zap diode relating to the invention, which will be described using the references of parts from the bipolar transistor formed at the same time with the zener zap diode, comprises the steps of: forming a first conductive layer as a base lead electrode so as to overlay a surface of a semiconductor substrate in which an outer base region constituting a PN junction of the zener zap diode is to be formed; forming a second conductive layer as an emitter lead electrode so as to overlay a surface of a semiconductor substrate in which an emitter region constituting the PN junction is to be formed; forming the outer base region and the emitter region, respectively, in areas adjacent to surfaces of the semiconductor substrate overlaid by the first conductive layer and the second conductive layer; and forming a contact between the first conductive layer and a metal interconnecting layer for a base electrode so that at least a part of the contact is disposed to overlie the outer base region.

Another method of manufacturing a zener zap diode relating to the invention, which will be described using the references of parts from the bipolar transistor formed at the same time with the zener zap diode, comprises the steps of: selectively forming a device isolation film on a first conductive type semiconductor substrate, and afterward, selectively forming an insulation film for determining a device active region on the semiconductor substrate and the device isolation film; forming a first conductive layer containing second conductive type impurities on the semiconductor substrate of the device active region determined by the insulation film; forming a field insulation film on the first conductive layer, and afterward, forming a first pit reaching the semiconductor substrate on a specific position in the device active region through both of the field insulation film and the first conductive layer; forming an active base region by introducing first conductive type impurities into the semiconductor substrate through the first pit; forming a side wall insulation film around the side wall of the first pit, and afterward, forming a second conductive layer containing the first conductive impurities so as to overlay an inside of the first pit; forming an emitter region and an outer base region connected to the active base region by diffusing the second conductive impurities in the first conductive layer and the first conductive impurities in the second conductive layer into the semiconductor substrate; and forming a second pit on the field insulation film formed on the first conductive layer so that at least a part of the second pit is disposed to overlie the outer base region, and thereby forming a contact between the first conductive layer and a metal interconnecting layer for a base electrode.

In the zener zap diode relating to the present invention, the contact between the conductive layer (first conductive layer) and the metal interconnecting layer for the base electrode is disposed so as to overlie the outer base region. Consequently, there is a less insulation film under the conductive layer compared to a conventional one, or not any insulation film under the conductive layer which hinders forming the filament when the zener zap trimming is conducted. Accordingly, the filament is widely formed to expand into the semiconductor substrate under the conductive layer.

BRIEF DESCRIPTION OF THE DRAWINGS

The present invention will be fully understood from the detailed description given below and from the accompanying drawings of the preferred embodiments of the invention, which, however, should not be taken to limit the specific embodiment, but are for explanation and understanding, in which.

DESCRIPTION OF THE PREFERRED EMBODIMENT

Preferred embodiments of the present invention will hereafter be described in detail with reference to the accompanying drawings.

Figure 3:
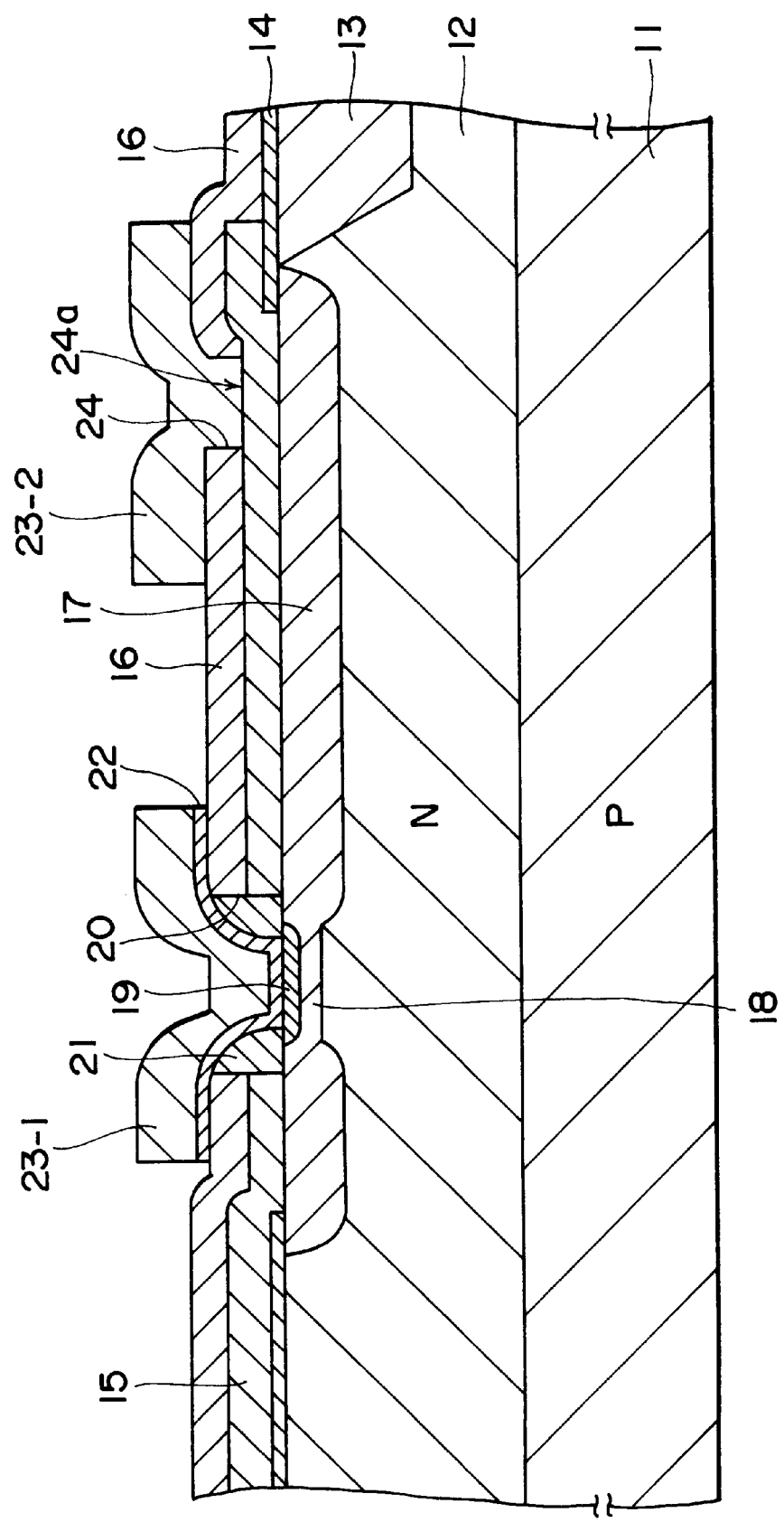
FIG. 3 is a sectional view for explaining the construction of the zener zap diode relating to one embodiment of the present invention.

FIG. 3 shows a sectional construction of a zener zap diode relating to one embodiment of the invention, which will be described using the references of parts from the bipolar transistor formed at the same time with the zener zap diode.

Figure 1:
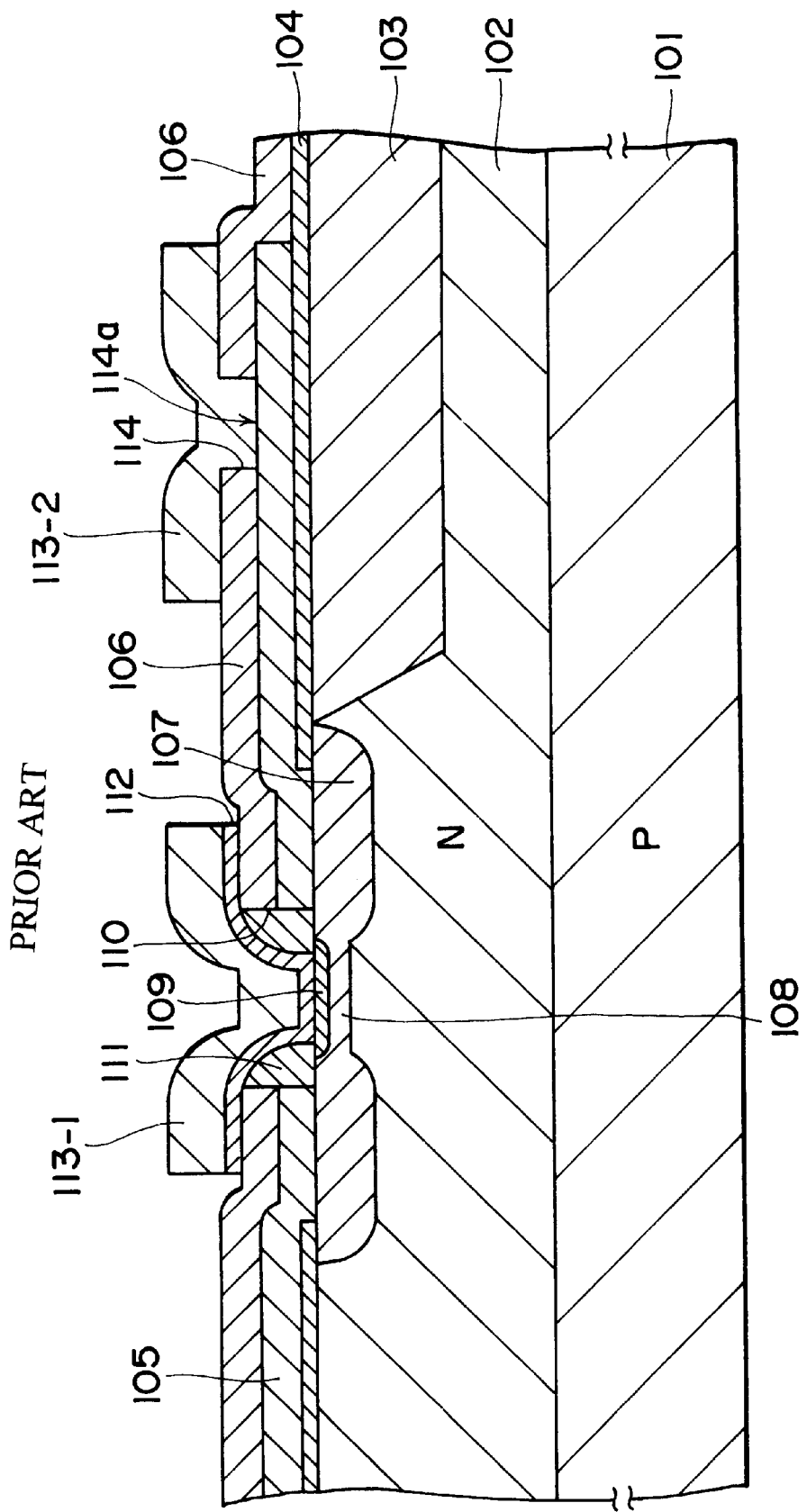
FIG. 1 is a sectional view showing a construction of a conventional zener zap diode.
Figure 2:
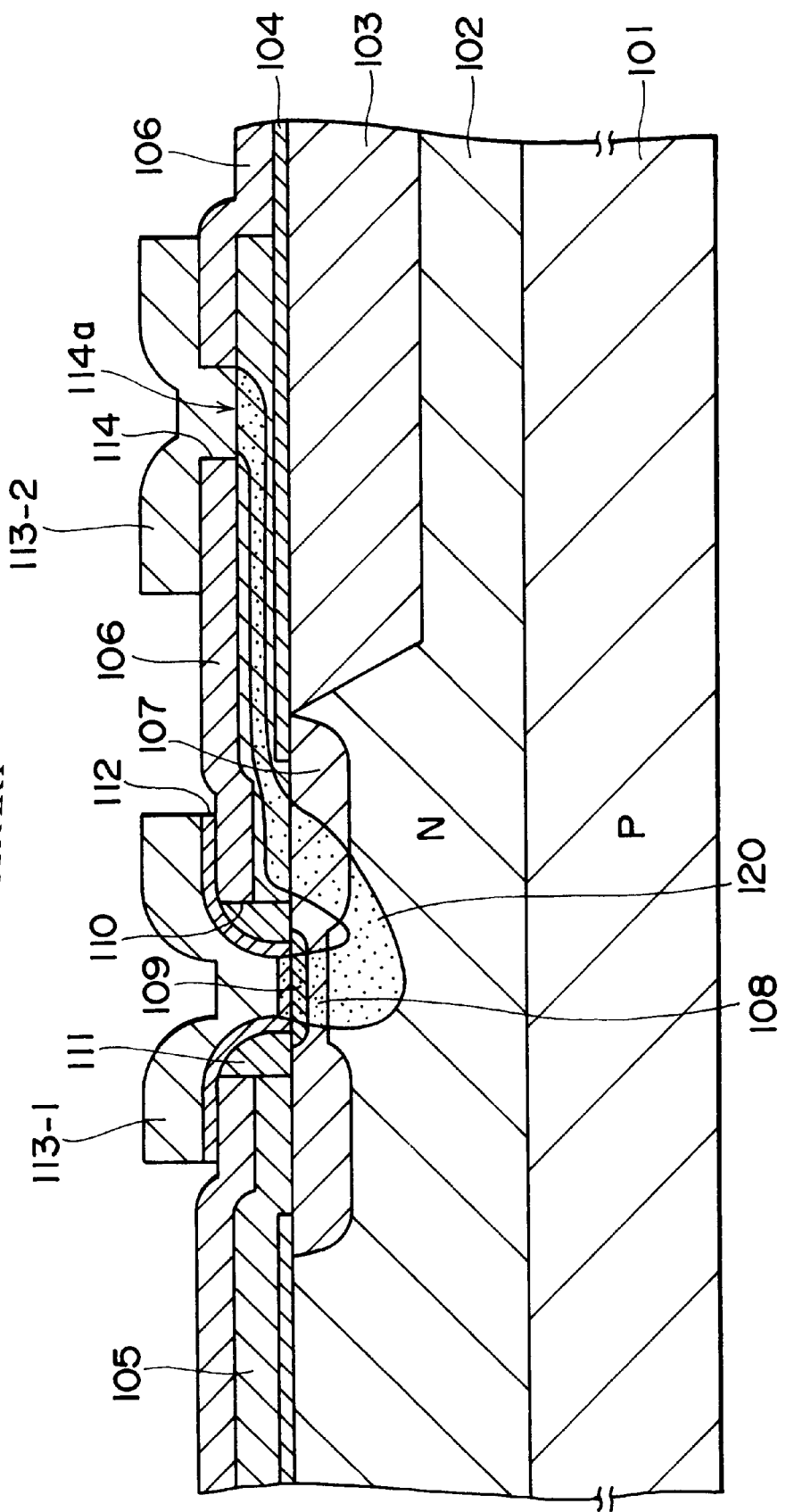
FIG. 2 is a sectional view showing a state when the zener zap trimming is conducted to the zener zap diode of FIG. 1.

As shown in this figure, a device isolation film 13 by means of the LOCOS method is selectively formed on an N-type well area 12 formed on a P-type silicon substrate 11. An insulation film 14 for determining an area in which a P-type outer base region 17 is selectively formed. A first polysilicon layer 15 as a base lead electrode (first conductive layer) is formed so as to overlay a part of the insulation film 14 and the silicon substrate 11. The polysilicon layer 15 is overlaid with a field insulation film 16. However, in this embodiment, the device active region in the silicon substrate 11 determined by the insulation film 14 is more widely allocated compared to the conventional one (FIG. 1).

An outer base region 17 and an active base region 18 which are made of a P-type impurity diffusion layer and constitute a base region are formed in areas adjacent to the surface of the silicon substrate 11. Here, the outer base region 17 is made wider than the conventional one, as mentioned above. An emitter region 19 as an N-type impurity diffusion layer is formed on the silicon substrate 11 on the upper side of the active base region 18. The emitter region 19 and the active base region 18 constitute a PN junction of the zener zap diode therebetween.

A pit 20 reaching the emitter region 19 through the polysilicon layer 15 and the field insulation film 16 is formed on the upper area of the emitter region 19. A side wall insulation film 21 made of a silicon oxide film is formed around the inner wall of the pit 20 to electronically isolate the emitter region 19 from the polysilicon layer 15. A second polysilicon layer 22 as an emitter lead electrode (second conductive layer) is formed on the emitter region 19, which is patterned to extend to the side wall insulation film 21 and a part of the field insulation film 16. A metal interconnecting layer 23-1 for connecting the emitter lead electrode is selectively formed to overlay the polysilicon layer 22.

The first polysilicon layer 15 extends to overlay the wide outer base region 17 and a part of the insulation film 14 near the edge of the device isolation film 13. The field insulation film 16 above the outer base region 17 is provided with a pit 24 reaching the polysilicon layer 15, which forms a contact 24a between the polysilicon layer 15 and a metal interconnecting layer 23-2 for the base.

Figure 4:
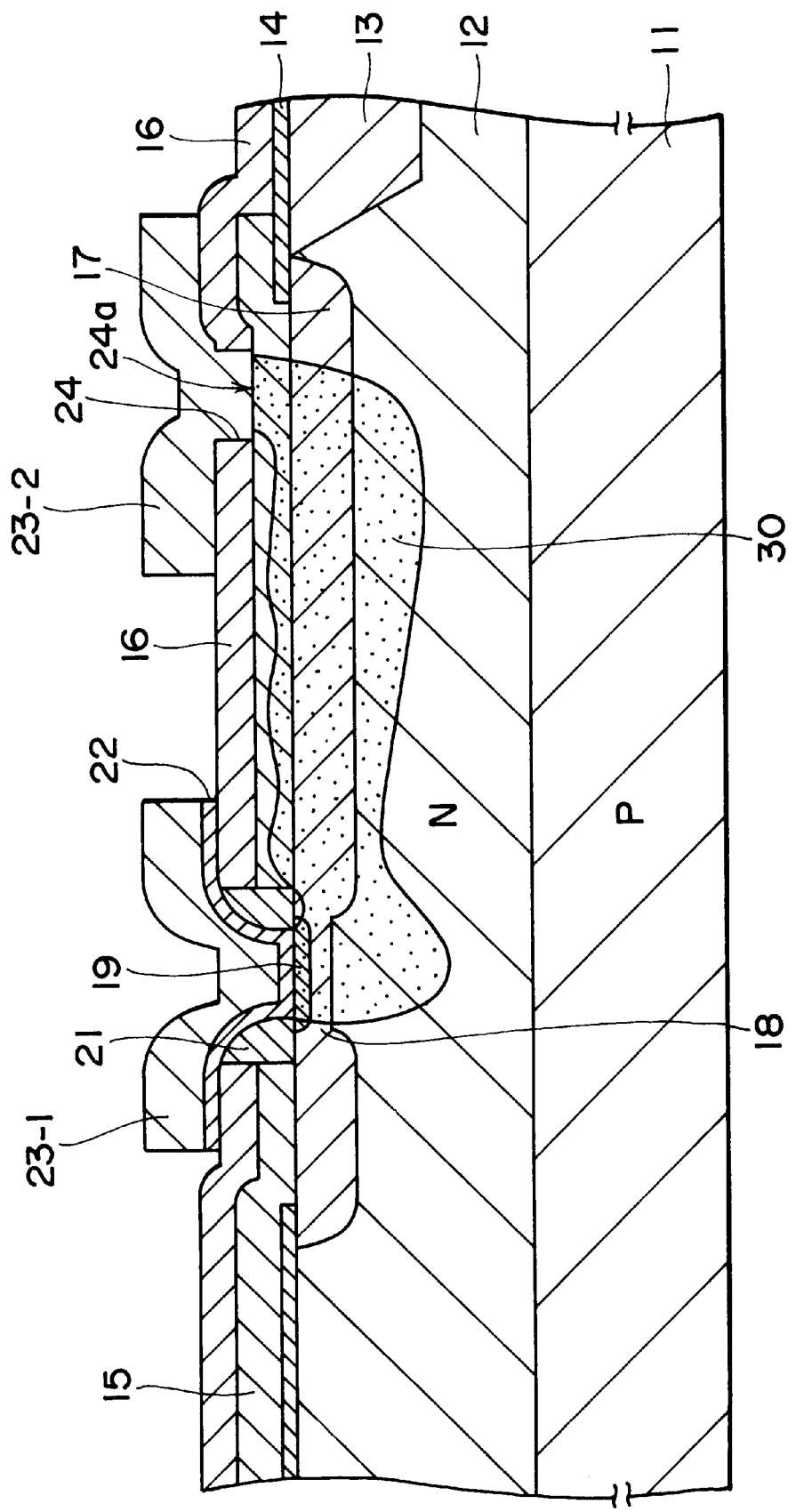
FIG. 4 is a sectional view showing a state when the zener zap trimming is conducted to the zener zap diode of FIG. 3.

Thus in this embodiment, the contact 24a for leading out the outer base is formed not above the device isolation film 13, but above the outer base region 17. Therefore, under the first polysilicon layer 15 as the outer base lead electrode, there are not any insulation films (device isolation film 13 and insulation film 14) to hinder forming the filament, which is totally different form the conventional one. Consequently, applying the zener zap trimming method to a zener zap diode of this construction, namely, short-circuiting the active base region 18 and the emitter region 19 to zap the PN junction will form a filament 30, as shown in FIG. 4, which extends not only into the polysilicon layer 15, but also widely into the N-type well region 12. Therefore, the zener zap diode of this construction will not produce damages such as cracks due to an excessive stress to the field insulation film 16, or will not increase the resistance between the metal interconnecting layer 23-1 and 23-2 after the trimming. Furthermore, in this embodiment, the area in which the filament 30 is formed is comparably stabilized, and the resistance does not widely disperse by each trimming.

Next, the method of manufacturing the zener zap diode of the foregoing construction will be described using the references of parts from the bipolar transistor formed at the same time with the zener zap diode.

Figure 5:
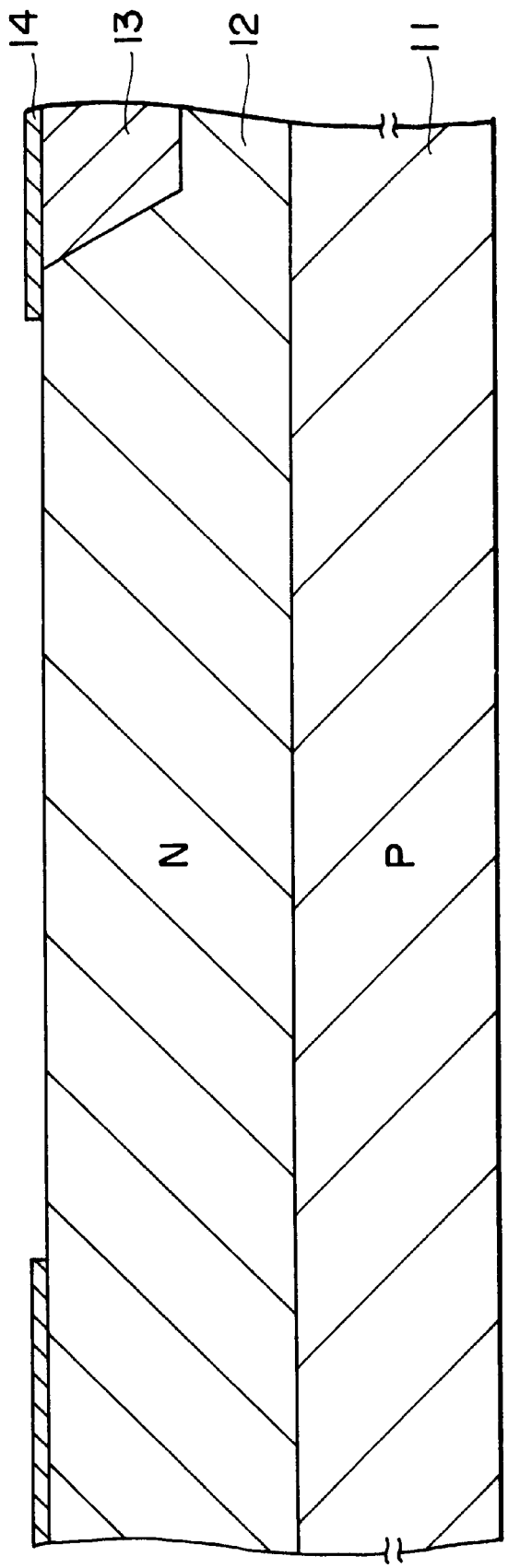
FIG. 5 is a process chart for explaining the method of manufacturing the zener zap diode of FIG. 3.

As shown in FIG. 5, an N-type monocrystal silicon layer is deposited in epitaxy on the P-type silicon substrate 11 to form the N-type well region 12, and afterward, the device isolation film 13 of a silicon oxide film is selectively formed in the N-type well region 12 by means of the LOCOS method. Furthermore, the isolation film 14 (silicon oxide film) for determining an area in which the outer base region 17 is formed is selectively formed on the device isolation film 13 and the N-type well region 12 by, for example, the thermal oxidation method. Here, the device active region of the silicon substrate 11 determined by the isolation film 14 is allocated wider than the conventional one.

Figure 6:
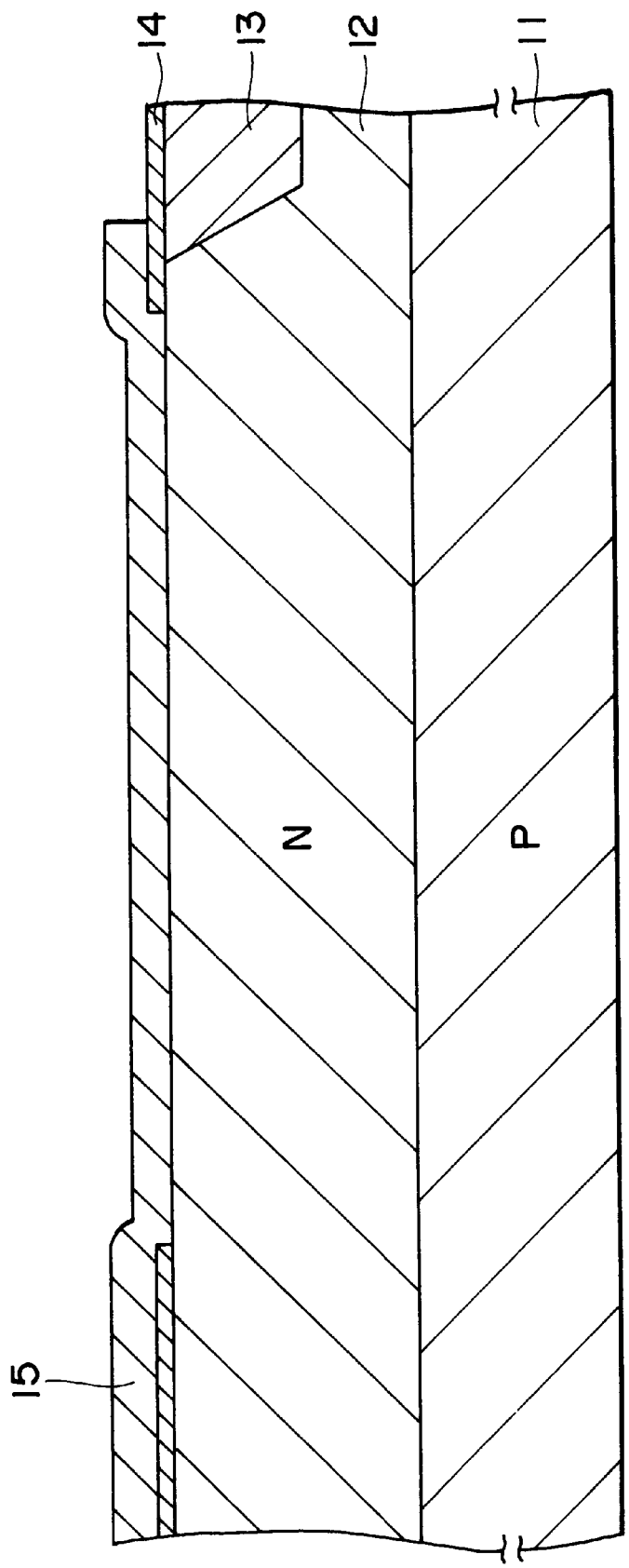
FIG. 6 is a process chart to follow FIG. 5.

Next, as shown in FIG. 6, the first polysilicon layer 15 as the base lead electrode is formed so as to overlay a part of the isolation film 14 and the silicon substrate 11 by means of, for example, the Chemical Vapor Deposition (CVD) method. And afterward, a P-type impurity, for example, a boron, is doped into the whole surface of the polysilicon layer 15, and furthermore, a part of the device isolation film 13 is selectively removed by patterning the polysilicon layer 15.

Figure 7:
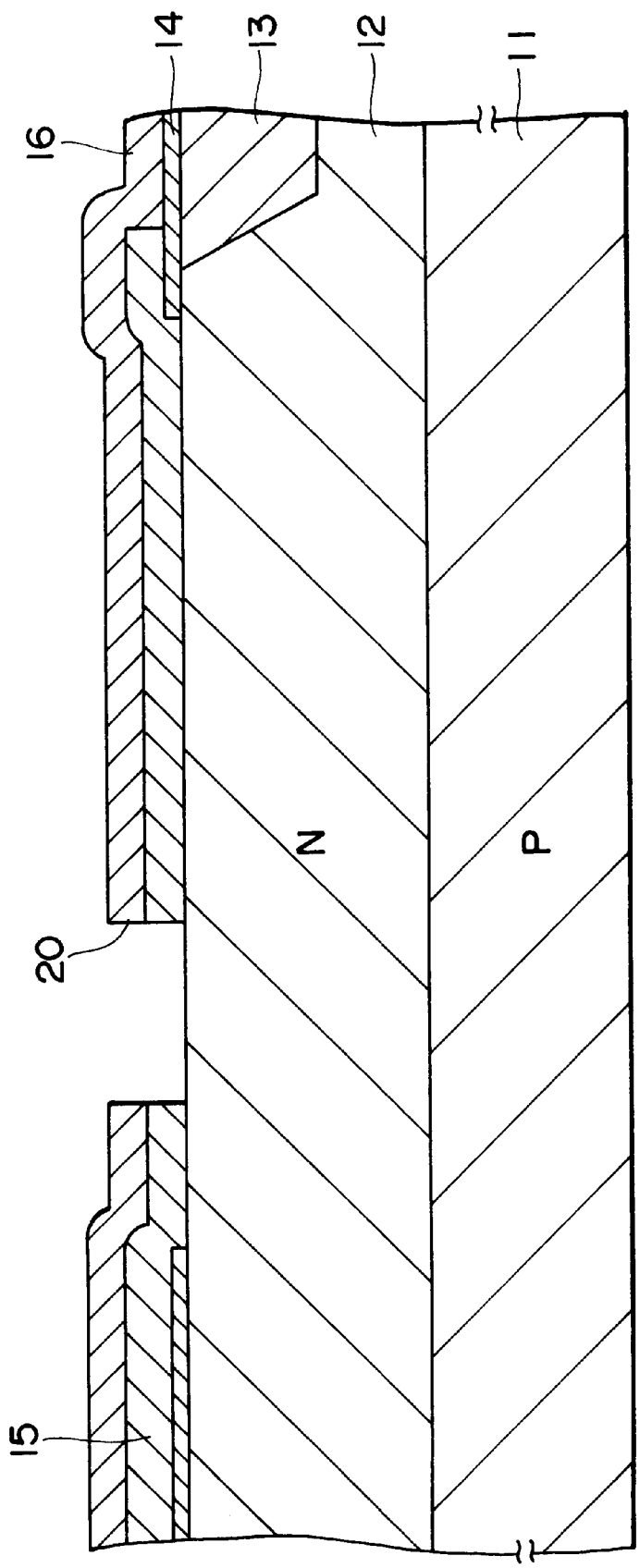
FIG. 7 is a process chart to follow FIG. 6.

Next, as shown in FIG. 7, the field insulation film 16 of the silicon oxide film is formed on the whole surface by means of, for example, the CVD method. And afterward, the pit 20 is formed to reach the silicon substrate 11 through the field insulation film 16 and the polysilicon layer 15.

Figure 8:
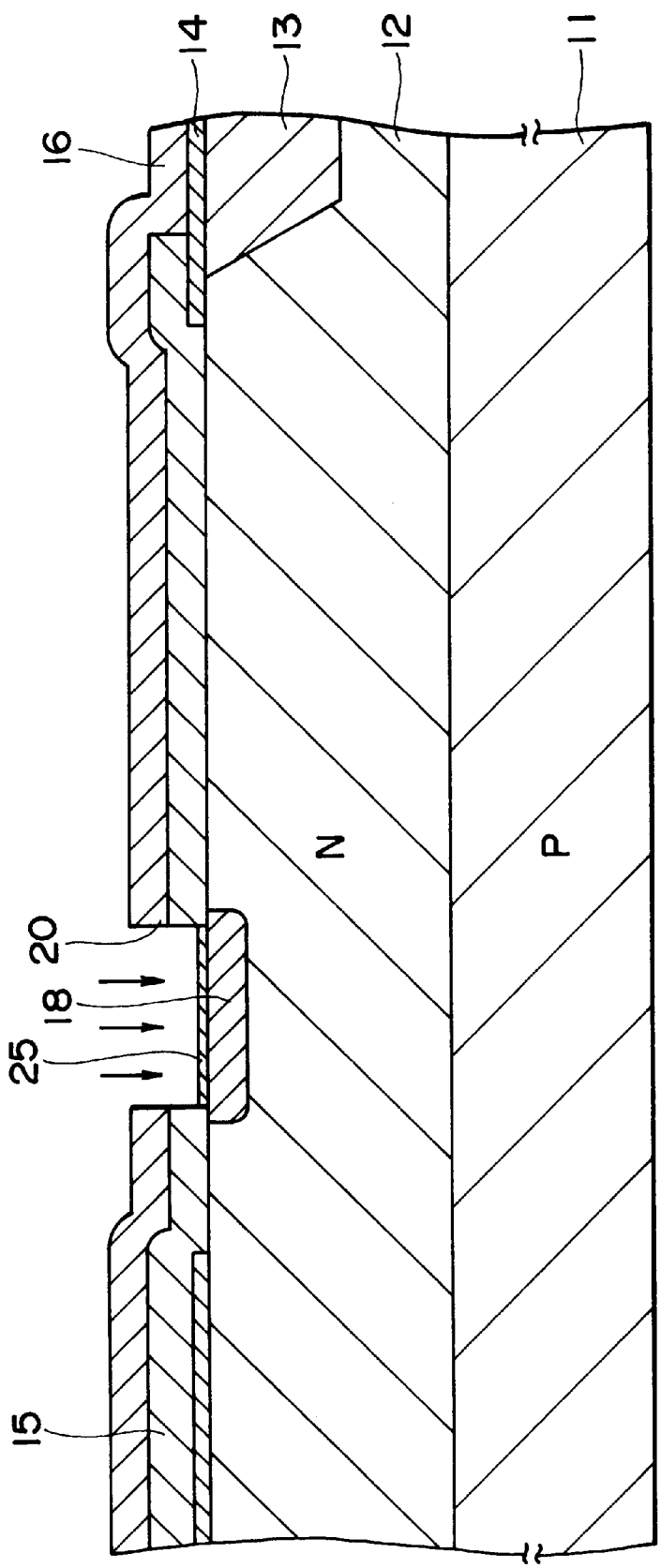
FIG. 8 is a process chart to follow FIG. 7.

Next, as shown in FIG. 8, a thin silicon oxide film 25 is formed on the silicon substrate 11 in the pit 20, and afterward, for example, ions of boron are implanted through this pit 20 into the silicon substrate 11 to form the P-type active base region 18.

Figure 9:
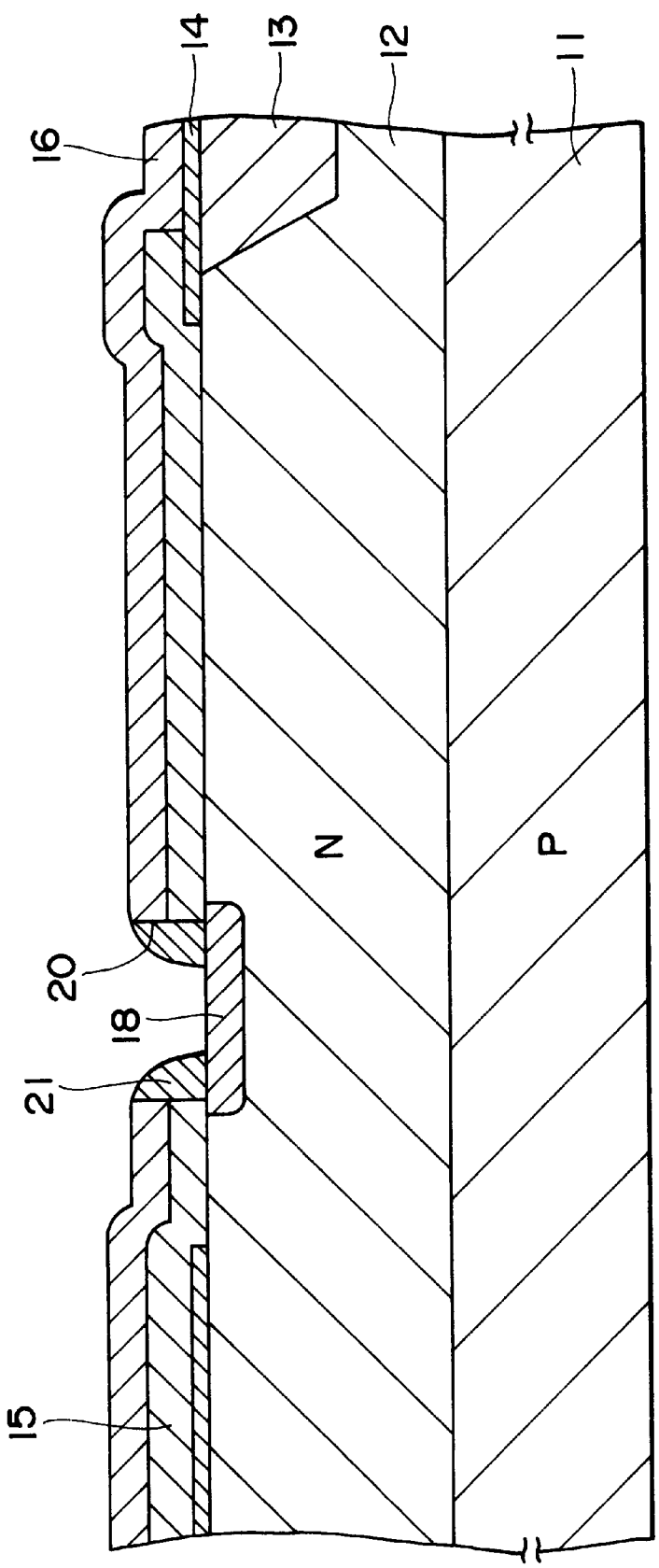
FIG. 9 is a process chart to follow FIG. 8.

Next, as shown in FIG. 9, after the silicon oxide film being formed on the whole surface, the side wall insulation film 21 is formed around the inner wall of the pit 20 by applying etching on the whole surface by means of the anisotropic etching method.

Figure 10:
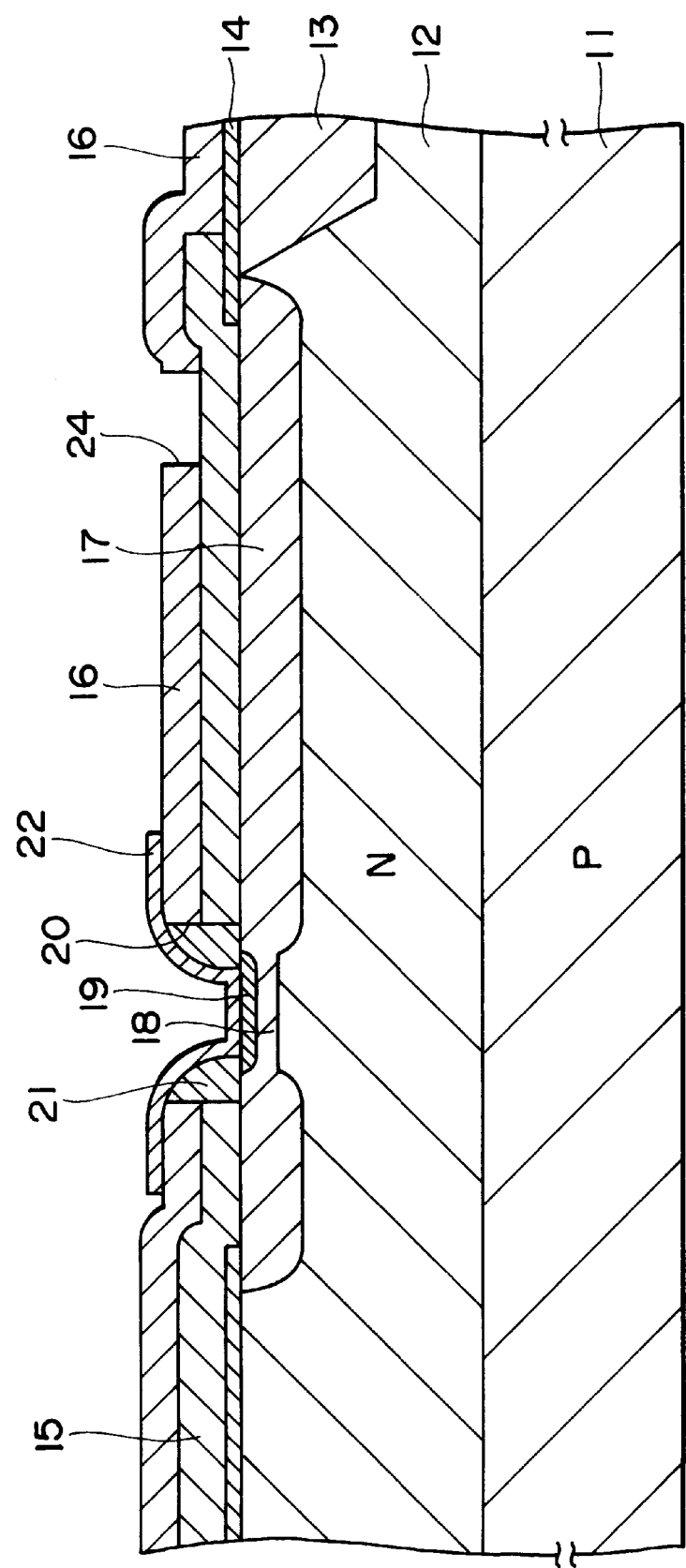
FIG. 10 is a process chart to follow FIG. 9.

Next, as shown in FIG. 10, the second polysilicon layer is formed on the whole surface, and afterward, an arsine (As) being an N-type impurity is doped into the whole surface, and the surface is patterned to form the polysilicon layer 22 as the emitter lead electrode. And then, the arsine in the polysilicon layer 22 is diffused into the active base region 18 by annealing to form the emitter region 19. And, the boron in the polysilicon layer 15 is diffused into the N-type well region 12 to form the outer base region 17.

Next, as shown in FIG. 10, the pit 24 reaching the polysilicon layer 15 is formed on the field insulation film 16 overlying an area of the polysilicon layer 15 which does not overlap with the insulation film 14 and the device insolation film 13, namely, an area right above the outer base region 17. And then, the metal interconnecting layer of aluminum or the like is formed on the whole surface, which is patterned to form the metal interconnecting layer 23-1 for the emitter lead electrode on the polysilicon layer 22, and the metal interconnecting layer 23-2 for the base lead electrode is formed so as to overlay the pit 24.

And afterward, a protection film not illustrated is formed on the whole surface to complete the manufacturing process.

In IC chips integrated with bipolar transistors of a polysilicon double layer structure, the processes of forming the zener zap diode described above can be done at the same time with the processes of forming the bipolar transistors; and therefore, the zener zap diode can be formed without increasing the processes. In this case, the process can be applied to both of the NPN-type and the PNP-type bipolar transistors. However, in case of a mixed integration with the PNP-type bipolar transistor, it is necessary to form an N-type epitaxial layer on a P-type silicon substrate, to form a P-type well region on this N-type epitaxial layer, and to form an emitter as a P-type impurity diffusion region and a base as an N-type impurity diffusion region.

Furthermore, in the zener zap diode, since the parasitic capacity of the outer base region 17 does not have a significant influence, there is not much problem even if the contact 24a for the base lead electrode is not disposed above the device insulation film 13.

The present invention is not confined to the foregoing embodiment, but various modifications and changes are possible. In the foregoing embodiment, for instance, whole the contact 24a for the base lead electrode is disposed right above the outer base region 17, however, only a part of the contact 24a may be disposed right above the outer base region 17. In such a construction, although the area in which the filament 30 is formed is slightly restricted compared to the aforementioned embodiment, the area becomes wider than the conventional one, thus achieving the foregoing effect.

As described hereinabove, according to the zener zap diode and the manufacturing method of the same relating to the present invention, at least a part of the contact between the conductive layer and metal interconnecting layer for the base electrode is disposed to overlie the outer base region so that the insulation film does not underlie the conductive layer as much as possible. Therefore, the filament, the alloy made of the metal and the material of the semiconductor substrate when the zener zap trimming is conducted can be formed widely into the area of the semiconductor substrate under the conductive layer without being restricted. Thus, the filament is not confined to being formed only in the conductive layer due to the presence of the insulation film thereunder as in the conventional one. Therefore, damages such as cracks caused by an excessive stress to the field insulation film overlying the conductive layer and the resistance increase of devices after trimming can be avoided. Furthermore, since the area in which the filament is formed is comparably stabilized, the resistance by each trimming is rarely widely dispersed. That is, a sufficient reliability will be secured to the IC chip regenerated by the trimming.

While the specific embodiments of the present invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A Zener zap diode comprising:

a semiconductor substrate having a substrate surface;

a first diode region of a first conductivity type disposed in said substrate;

a second diode region of a second conductivity type disposed in said substrate and forming a PN junction in combination with said first diode region in an area adjacent to the substrate surface;

a first metallized region on said substrate surface electrically connected to said PN junction;

a third region of said first conductivity type in said substrate, said third region being an extension of said first region and being spaced from said PN junction;

a conductive layer overlying said third region on said substrate surface;

a second metallized region in electrical contact with said conductive layer, said second metallized region being separate and spaced from said first metallized region and forming an interface with said conductive layer, at least a portion of said interface overlying said third region; and said substrate and said conductive layer having a path between said first metallized region and said second metallized region which is substantially free of any insulating material to allow formation of a conductive path between said first metallized region and said second metallized region for zap trimming.

* * * * *